United States Patent [19]

Lin et al.

[11] 4,427,937
[45] Jan. 24, 1984

[54] METHOD OF MEASURING TIME CONSTANT USING A SPECTRUM ANALYZER

[76] Inventors: Hung C. Lin, 8 Schindler Ct., Silver Spring, Md. 20903; Ching D. Wang, 2820 Rainview Dr., San Jose, Calif. 95133

[21] Appl. No.: 305,376

[22] Filed: Sep. 25, 1981

[51] Int. Cl.³ .............................................. G01R 23/16
[52] U.S. Cl. ................................... 324/77 B; 324/77 C
[58] Field of Search ............... 324/77 B, 77 C, 77 CS, 324/158 D

[56] References Cited

U.S. PATENT DOCUMENTS 4,200,840  4/1980  Tsui .................................... 324/77 B

OTHER PUBLICATIONS

J. K. Skilling, "Testing with Tone-Burst Signals", The Electronic Engineer, Dec. 1966, pp. 66–70.

*Primary Examiner*—Michael J. Tokar

[57] ABSTRACT

A method of measuring the time constant of an exponential waveform using a spectrum analyzer. From the different output Fourier components, one can calculate the time constant. This method is suitable for deep level transient spectroscopy for determining the emission rate and activation energy of traps in semiconductors.

4 Claims, 3 Drawing Figures

METHOD OF MEASURING TIME CONSTANT USING A SPECTRUM ANALYZER

BACKGROUND OF THE INVENTION

The present invention is related to electrical measurement in general, particularly for the characterization of semiconductor devices.

In electronics, there is often a need to determine the time constant of the transient response of a circuit or a device. For device characterization, the transient response may be sensitive to temperature. One application of such a measurement is to determine the emission rate and the activation energy of traps in semiconductors. The presence of traps can affect the performance of a semiconductor device because they create recombination centers which can shorten the diffusion length and the lifetime of the carriers of the semiconductor. A short lifetime decreases the efficiency of a solar cell and the gain of a transistor.

One method of determining the trap emission rate and its activation energy is the deep level transient spectroscopy technique, as described by D. V. Lang, in the *Journal of Applied Physics*, P. 3014, 1974. In this method, an electrical pulse is applied to a p-n junction of semiconductor material, the trap emission rate and trap activation energy of which are to be determined. The polarity of the pulse is such that a depletion layer is first created and then collapsed. The excess charge introduced by the pulse will be captured by those traps which are now in the neutral region. The time it takes for the carriers to escape after the pulse disappears is a measure of the trap emission rate. This is indicated by the time constant of the transient response.

In measuring the time constant of the transient response, one may encounter noise problems. If the junction capacitance area is small, the signal to noise ratio of the transient response may be low. Special techniques have been developed to maximize the signal-to-noise ratio. One popular method is the "double box-car" method as described by Lang in the *Journal of Applied Physics*, P. 3023, 1974. In the double box method, the amplitude difference of the transient response at a fixed time interval is measured. The pulse repetition rate is fixed, but the temperature of the sample is varied. At a certain temperature, the amplitude difference is at a maximum. This maximum amplitude is an indication of emission rate. By changing the sampling time, the maximum response occurs at different temperatures. From a plot of logarithmic time constant versus temperature, the activation energy of the trap level can be determined by the slope.

Another method of determining the time constant is to use a lock-in amplifier instead of a double box-car. Maximum output occurs at a certain temperature when the lock-in amplifier operating frequency is correlated with the fundamental component of the transient response. This method was described by Kimerling in the *Annual Review of Material Science*, p. 417, 1977.

In either the double box-car or the lock-in amplifier method it is necessary to scan the temperature. The drawbacks of temperature scanning are that (a) it is time consuming, and (b) it is difficult to hold the test sample temperature constant while the temperature is scanned. There is a need for improvement.

SUMMARY OF THE INVENTION

An object of this invention is to measure the time constant of the transient response of a circuit or a device.

Another object of the invention is to measure the time constant of the transient response of a circuit or a device rapidly.

Still another object of the invention is to measure the time constant of the transient response of a device at different fixed temperatures.

A final object of the invention is to implement deep level transient spectroscopy for semiconductors rapidly at few discrete temperatures without resorting to continuous temperature scanning.

These objects are achieved in the present invention are achieved by feeding the transient response signal to a spectrum analyzer. From the different Fourier components of the spectrum analyzer output, one can derive the time constant.

DETAILED DESCRIPTION OF THE PREFERRED EMBODIMENT

Figure 1:
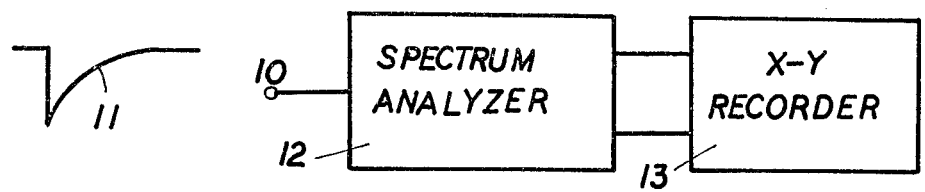
FIG. 1 is a basic block diagram of using a spectrum analyzer to measure time constant in accordance with the present invention.

Referring to the drawings, FIG. 1 is a basic block diagram of using a spectrum analyzer to measure the time constant of an exponential waveform. In this diagram, an exponential waveform 11 is fed to input 10 of a spectrum analyzer 12. The output of the spectrum analyzer can be displayed on a cathode ray tube or an x-y recorder, 13.

Figure 2:
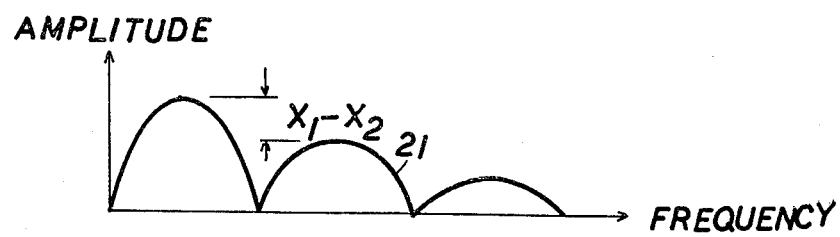
FIG. 2 is an output waveform of a spectrum analyzer when an exponential waveform is applied at the input.

The displayed output waveform 21 is shown in FIG. 2. The peaks of such a waveform indicate the amplitudes of the different Fourier components. The largest peak amplitude is the fundamental component. The next largest peak is the second harmonic, etc.

The principle of our measurement method is as follows: Any periodical function f(t) with period $\tau$ can be expanded as a Fourier series $$f(t) = \sum_{n=0}^{\infty} (A_n \sin n\omega t + B_n \cos n\omega t) \qquad (2)$$

$$= \sum_{n=0}^{\infty} C_n \sin(n\omega t + \theta_n).$$

Now, let us consider f(t) as a periodical exponential function, i.e., $$f(t) = Ae^{-t/\tau_s} \text{ for } 0 \leq t \leq \tau, \qquad (3)$$

then $$A_n = \frac{2}{\tau} \int_0^\tau Ae^{-t/\tau_s} \sin n\omega t \, dt = \frac{4\pi A n a^2}{1 + 4\pi^2 n^2 a^2} (1 - e^{-1/a}),$$

$$B_n = \frac{2}{\tau} \int_0^\tau Ae^{-t/\tau_s} \cos n\omega t \, dt = \frac{-2aA}{1 + 4\pi^2 n^2 a^2} (1 - e^{-1/a}),$$

-continued $$C_n = (A_n^2 + B_n^2)^{\frac{1}{2}} = \frac{2Aa(1 - e^{-1/a})}{(1 + 4\pi^2 n^2 a^2)^{\frac{1}{2}}}.$$

where $\omega\tau = 2\pi$, $a \equiv \tau_s/\tau$, $$A_n = \frac{2}{\tau} \int_0^\tau f(t) \sin n\omega t \, dt,$$

$$B_n = \frac{2}{\tau} \int_0^\tau f(t) \cos n\omega t \, dt,$$

$$C_n = (A_n^2 + B_n^2)^{\frac{1}{2}}.$$

If we use a spectrum analyzer to analyze this exponential wave, $C_n$ should appear on the linear scale corresponding to the fundamental component and the harmonic components. For simplicity of mathematical manipulation, we chose the log scale on a spectrum analyzer instead of the linear scale. Considering the amplitudes of fundamental component and second harmonic on the log scale, $$x_1 = 20 \log_{10} \frac{2Aa(1 - e^{-1/a})}{(1 + 4\pi^2 a^2)^{\frac{1}{2}}},$$

$$x_2 = 20 \log_{10} \frac{2Aa(1 - e^{-1/a})}{(1 + 16\pi^2 a^2)^{\frac{1}{2}}},$$

$$x_1 - x_2 = 10 \log_{10} \frac{1 + 16\pi^2 a^2}{1 + 4\pi^2 a^2},$$

where $x_1, x_2$ are corresponding amplitudes of first and second harmonics in dB. Thus $$a \equiv \frac{\tau_s}{\tau} = \frac{1}{2\pi} \left( \frac{10^C - 1}{4 - 10^C} \right)^{\frac{1}{2}}, \quad C \equiv \frac{x_1 - x_2}{10}. \tag{4}$$

Hence by simple calculation using Eq. (4) for the first two (or any two) harmonic components, the exponential decay time constant $\tau_s$ of any signal can be obtained.

Figure 3:
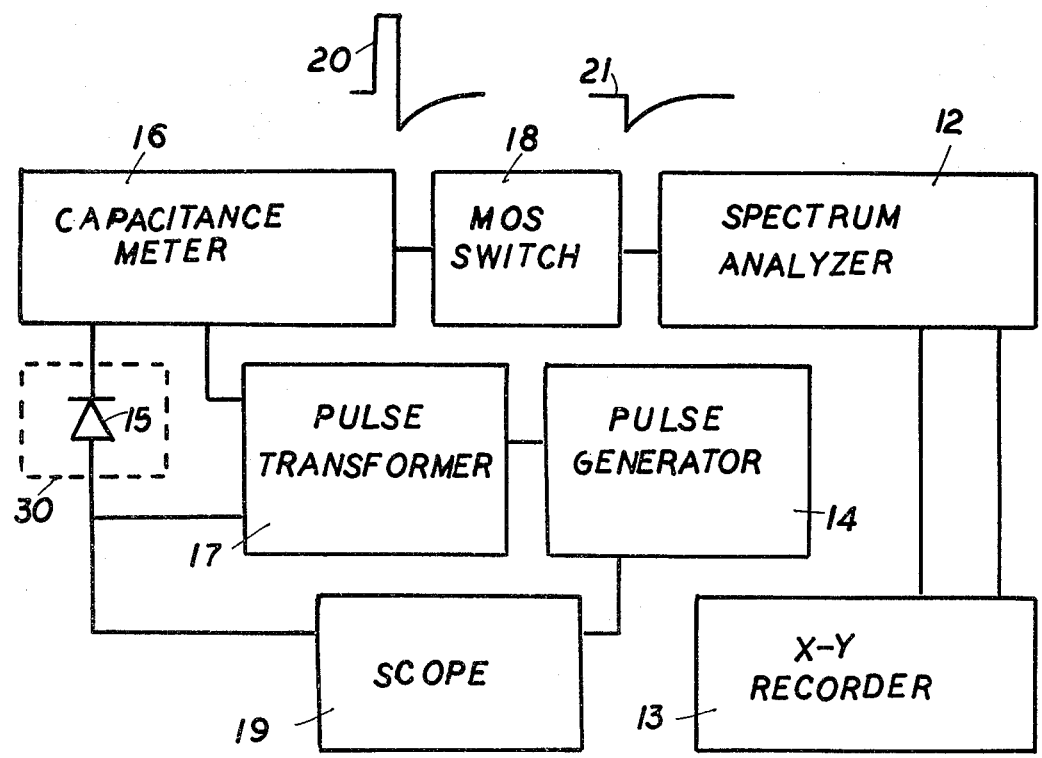
FIG. 3 is a block diagram of a deep level transient spectroscopy system using a spectrum analyzer in accordance with the present invention.

FIG. 3 shows a Deep Level Transient Spectroscopy system using this invention. This system is used to measure the emission rate and the activation energy of the traps in semiconductor. The test sample is a p-n junction semiconductor diode 15. A metal-semiconductor Schottky barrier diode can also be used. This diode is housed in a temperature chamber 30. The temperature of this chamber can be controlled from a low temperature, say 10 degrees Kelvin, to room temperature. Pulse from the pulse generator 14 is fed to a pulse transformer 17. The pulse transformer is to isolate the dc ground of the pulse generator from the ground of the secondary of the transformer. The pulse from the secondary of the pulse transformer drives the diode 15. The capacitance of the diode is measured by a capacitance meter 16. The output of the capacitance meter is a waveform 20 which has a positive going exponential portion and a negative going exponential portion. The negative going portion has time constant which indicates the trap emission rate. The positive going exponential wave does not contribute to the measurement and is clipped off by an MOSFET switch 18. The waveform 21 at the output of the MOSFET 18 is a negative going exponential waveform similar to waveform 1 described in FIG. 1. This waveform is then fed to a spectrum analyzer 12 which analyzes the wave and gives different Fourier components as described in FIG. 1. An oscilloscope 19 monitors the pulse.

While FIG. 3 is described for a specific DLTS application, it should be understood that this method can be used to measure any time constant of an electronic circuit or device.

What is claimed:

1. A method of measuring the time constant of an exponential waveform, comprising the steps of applying an electrical pulse to a diode, measuring the capacitance of said diode, measuring the capacitance of said diode during the transient response with a capacitance meter, producing an exponential waveform from the output of said capacitance meter, applying said exponential waveform to a spectrum analyzer to derive different Fourier components, calculating the time constant of said exponential waveform from two said Fourier components.

2. A method of measuring the time constant of an exponential waveform as described in claim 1, wherein said diode is housed in a variable temperature chamber.

3. A method of measuring the time constant of an exponential waveform as described in claim 2, wherein the trap emission rate of said diode is determined.

4. A method of measuring the time constant of an exponential waveform as described in claim 3 wherein said trap emission rate is used for deep level transient spectroscopy.

* * * * *